(12) United States Patent
Hsu et al.

(10) Patent No.: US 10,564,632 B2
(45) Date of Patent: Feb. 18, 2020

(54) SYSTEMS AND METHODS FOR SENSORY AUTOMATED MATERIAL HANDING

(71) Applicant: Taiwan Semiconductor Manufacturing Co., Ltd., Hsinchu (TW)

(72) Inventors: Yung-Lin Hsu, Hsin-Chu (TW); Richard Lin, Keelung (TW); Chiung-Min Lin, Zhubei (TW); Alan Yang, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 29 days.

(21) Appl. No.: 15/883,497

(22) Filed: Jan. 30, 2018

(65) Prior Publication Data

US 2019/0163170 A1 May 30, 2019

Related U.S. Application Data

(60) Provisional application No. 62/592,010, filed on Nov. 29, 2017.

(51) Int. Cl.
*G05B 19/418* (2006.01)
*H01L 21/677* (2006.01)

(52) U.S. Cl.
CPC .. *G05B 19/41815* (2013.01); *H01L 21/67703* (2013.01); *G05B 2219/45031* (2013.01)

(58) Field of Classification Search
CPC .... G05B 19/41815; G05B 2219/45031; H01L 21/67
See application file for complete search history.

(56) References Cited

U.S. PATENT DOCUMENTS

| 5,955,857 | A | * | 9/1999 | Kwon | G05B 19/4189 318/568.11 |
|---|---|---|---|---|---|
| 6,308,818 | B1 | * | 10/2001 | Bonora | B65G 19/02 198/414 |
| 6,580,371 | B2 | | 6/2003 | Chung | |
| 8,712,600 | B2 | | 4/2014 | Hayashi | |
| 9,305,815 | B2 | | 4/2016 | Tung et al. | |
| 2002/0134601 | A1 | | 9/2002 | Chung | |
| 2004/0118980 | A1 | * | 6/2004 | Chang | G01S 17/88 246/1 C |

(Continued)

FOREIGN PATENT DOCUMENTS

| TW | 494077 B | 7/2002 |
|---|---|---|
| TW | 201204619 A | 2/2012 |

OTHER PUBLICATIONS

Official Action dated Aug. 23, 2018, in corresponding Taiwan Patent Application No. 10720763350.

*Primary Examiner* — Christopher E. Everett
(74) *Attorney, Agent, or Firm* — Duane Morris LLP (57) ABSTRACT

In an embodiment an automated material handling system (AMHS) for a semiconductor fabrication facility (FAB) includes: a sensor supported by a rail, wherein the sensor is configured to collect sensor data characterizing a vehicle that moves along the rail, wherein the vehicle is configured to carry at least one wafer; and a monitoring module configured to: detect a trigger event based on the sensor data, and initiate a remediation action in response to the trigger event.

20 Claims, 6 Drawing Sheets

(56) References Cited

U.S. PATENT DOCUMENTS

| | | | |
|---|---|---|---|
| 2005/0192699 A1* | 9/2005 | Lin | H01L 21/67259 |
| | | | 700/121 |
| 2008/0051942 A1* | 2/2008 | Smith | F16F 15/005 |
| | | | 700/280 |
| 2011/0094546 A1* | 4/2011 | Valcore | H01L 21/67028 |
| | | | 134/137 |
| 2011/0251735 A1 | 10/2011 | Hayashi | |
| 2012/0027544 A1* | 2/2012 | Wang | H01L 21/67253 |
| | | | 414/222.01 |
| 2013/0230375 A1* | 9/2013 | Tung | H01L 21/67706 |
| | | | 414/592 |
| 2014/0200702 A1* | 7/2014 | Liu | G01N 29/14 |
| | | | 700/112 |
| 2017/0057750 A1* | 3/2017 | Ikenaga | B65G 43/00 |

\* cited by examiner

SYSTEMS AND METHODS FOR SENSORY AUTOMATED MATERIAL HANDING

CROSS-REFERENCE TO RELATED APPLICATIONS

This application claims priority to U.S. Application No. 62/592,010, filed Nov. 29, 2017. The content of the above application is incorporated by reference in its entirety.

BACKGROUND

Automated material handling systems (AMHS) have been widely used in semiconductor fabrication facilities (also termed as FABs) to automatically handle and transport groups or lots of wafers between various processing machines or tools used in chip manufacturing. A typical FAB may include a plurality of process bays including processing tools (e.g., a process tool) and wafer staging equipment which are interconnected by the AMHS.

Each bay may include a wafer stocker, which includes multiple bins for temporarily holding and staging a plurality of wafer carriers during the fabrication process. The wafer carriers may include standard mechanical interface (SMIF) pods which may hold a plurality of wafers, or front opening unified pods (FOUPs) which may hold larger wafers. Stockers generally include a single mast robotic lift or crane having a weight bearing capacity sufficient for lifting, inserting, and retrieving a single wafer carrier at one time from the bins. The stocker holds multiple SMIF pods or FOUPs in preparation for transporting a SMIF or FOUP to the loadport of a process tool.

A semiconductor FAB may include numerous types of automated and manual vehicles for moving and transporting wafer carriers throughout the FAB during the manufacturing process. These may include for example automatic guided vehicles (AGVs), personal guided vehicles (PGVs), rail guided vehicles (RGVs), overhead shuttles (OHSs), and overhead hoist transports (OHTs). An OHT system automatically moves OHT vehicles that carry and transport wafer carriers, such as SMIF pods or FOUPs holding multiple wafers, from a processing or metrology tool (e.g., process tool) or a stocker to the loadport of another tool or other apparatus in the FAB. The OHT system may be used to transport vehicles within each bay (intra-bay) or between bays (inter-bay). The OHT system also moves empty vehicles (i.e. without a wafer carrier) to the tool loadport or other apparatus for receiving and removing empty or full SMIF pods or FOUPs that may contain wafers for further transport and/or processing in other tools.

Handling and transport of wafers in correspondingly larger and heavier FOUPS creates efficiency challenges for the AMHS to maintain expedient wafer flow between process tools in the semiconductor FAB. In addition, construction of large Giga FABS with potential capacities to handle processing of more 100,000 wafers per month creates additional demands. These challenges and demands include efficient use of floor and overhead space in the FAB and reducing bottlenecks or vehicle traffic jams due to vehicle failures and/or damage.

Accordingly, an improved system and method for handling wafer transport in a semiconductor FAB is desired.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of an sensory automated material handling system (sensory AMHS) with sensors integrated with AMHS rails to monitor vehicles that move and transport wafers throughout a semiconductor fabrication facility (e.g., a FAB). The sensory AMHS may refer a variety of components of a semiconductor fabrication facility (FAB) which may be monitored and/or controlled in relation to sensor data collected from a sensor mounted on a rail, as will be discussed further below. These sensors may collect sensor data utilized by a monitoring module that may analyze the sensor data generated by the sensors for trigger events and to initiate a remediation action in response to trigger event occurrence detection. For example, the sensors may include noise and/or vibration sensors that collect noise and/or vibration sensor data on vehicles as they pass by the vicinity of the sensors. The collected noise and/or vibration sensor data may be analyzed to determine whether there are triggering events (e.g., an indication of upcoming vehicle failure) so that a remediation action (e.g., servicing of the vehicle) may be performed for the vehicle. Thus, vehicle failures while in active use (e.g., while the vehicle is being utilized for movement of wafers), and associated assembly line bottlenecks and disruptions to the manufacturing process, may be avoided.

The sensors of a sensory AMHS may be disposed on a rail of the sensory AMHS. In certain embodiments, multiple sensors may be utilized for different purposes in a sensory AMHS. For example, certain sensors may be utilized to identify a passing vehicle (e.g., a radio frequency identification (RFID) sensor) and other sensors utilized to characterize the performance of the passing vehicle (e.g., a sound sensor, vibration sensor, or image sensor). As another example, different sensors may be utilized to monitor performance of a passing vehicle in conjunction with each other, such as proximity sensors that determine a time for vehicle passing from one point to another and a sound sensor to characterize sounds or vibrations generated from the passing vehicle. This sensor data may be compared to better characterize the performance of the vehicle over a time period and in cross referencing for increased sensory accuracy. Furthermore, by cross referencing sensor data, sensor abnormalities may also be detected and remediated (e.g., fixed or replaced) at or before the point of sensor failure.

In further embodiments, a single sensor may be utilized for multiple purposes, such as to both identify a passing vehicle and characterize the performance of the passing vehicle. For example, an image sensor may collect image data, or a sound sensor may collect sound data that may identify the vehicle and also assess whether there is an abnormality in vehicle performance. In certain embodiments, it may be desirable to have sensors with smaller form factors so as to not overly encumber the rails of a sensory AMHS and/or to obstruct movement of a vehicle along the rails.

As noted above, proximity sensors may be utilized in a sensory AMHS. Examples of proximity sensors may include capacitive sensors, capacitive displacement sensors, Doppler effect sensors, eddy-current sensors, inductive sensors, magnetic sensors, optical sensors, radar sensors, sonar sensors, ultrasonic sensors, fiber optic sensors and hall effect sensors.

Also, as noted above, sound sensors may be utilized in a sensory AMHS. Examples of sound sensors may include condenser microphone sensors, radio frequency (RF) condenser microphone sensors, electret condenser sensors, dynamic microphone sensor, ribbon microphone sensors, carbon microphone sensors, piezoelectric microphone sensors, fiber optic microphone sensors, laser microphone sensors, liquid microphone sensors, and microelectromechanical systems microphone sensor.

In certain embodiments, as noted above, vibration sensors may be utilized in a sensory AMHS. Examples of vibration sensors may include velocity sensors, such as an electromagnetic linear velocity transducer sensor and electromagnetic tachometer generator sensors, and acceleration sensors, such as capacitive accelerometer sensors, piezoelectric accelerometer sensors, potentiometric accelerometer sensors, servo accelerometer sensors, and strain gage accelerator sensors.

In certain embodiments, as noted above, image sensors may be utilized in a sensory AMUS. Examples of image sensors may include charge coupled device (CCD) image sensors and complementary metal-oxide-semiconductor (CMOS) image sensors.

Although particular sensors are discussed herein, any type of sensor capable of generating sensor data characterizing performance of a vehicle may be utilized as desired for different applications in accordance with various embodiments. In certain embodiments, these sensors may be commercially available and will not be discussed in detail herein for brevity.

The sensor data may be utilized to assess a vehicle's performance. In certain embodiments, historical sensor data may be analyzed to determine a trigger event from historical sensor data that may indicate an abnormality. This historical sensor data evaluated to determine a trigger event. For example, historical sensor data may be collected from each passing of a vehicle, or each passing of a specific vehicle to determine a trigger event. This sensor data may be continuous (e.g., where each data point of historical sensor data represents a continuous collection of sensor data across a time period) or discontinuous (e.g., where each data point of historical sensor data represents a snapshot of a single sensor data value in time). Furthermore, historical sensor data may be aggregated and/or represented for analysis in a variety of manners in different embodiments. For example, historical sensor data may be represented in the time domain and/or the frequency domain for analysis, as will be discussed further below. In particular embodiments, this historical sensor data may be collected and aggregated in any of a variety of data structures, such as in a database, a relational table, a flat file, and the like.

A trigger event may be determined based on detection of an outlier from historical (e.g., aggregated) sensor data. Such an outlier may be indicative of abnormal performance of a vehicle. In certain embodiments, these outliers may determine threshold values, which when met or passed, may define a trigger event. The trigger events may be reflective of meeting or passing a single or a combination of threshold values. For example, these outliers may define threshold values for a vehicle that is too loud or that causes too many or abnormal vibrations (which may be indicative of a vehicle with damage). In certain embodiments, different trigger events may be defined that may be provoke different types of remediation. For example, different trigger events may be indicative of abnormalities of different parts of the vehicle, such as trigger events that are indicative of damage to a wheel as opposed to damage to a trolley used to suspend a vehicle from a rail.

These outliers may be determined in accordance with conventional statistical analysis for outliers. For example, the statistical analysis may include a noise, vibration harshness (NVH) study or analysis of historical sensor data. As a further example, the statistical analysis may include any of: an octave analysis, a spectrum analysis, a Fourier transform analysis, a joint time frequency analysis, an order analysis, an order tracking analysis, a bode plot analysis, a frequency response analysis, a vibration analysis, and a stress analysis, as will be discussed further below.

In a variety of embodiments, the sensor data characterizing the performance of the vehicle may be cross referenced and/or indexed with a particular vehicle. For example, a trigger event may be detected for a particular vehicle such that the remediation action may be specific for the particular vehicle. As noted above, sensor data may be utilized for characterization of vehicle performance and/or identification of a vehicle. Accordingly, based on the trigger event, an appropriate remediation action may be taken in response to the trigger event for a specific vehicle. For example, the damaged vehicle may be controlled to move to a remediation area and repair personnel notified to perform the appropriate remediation.

Figure 1A:
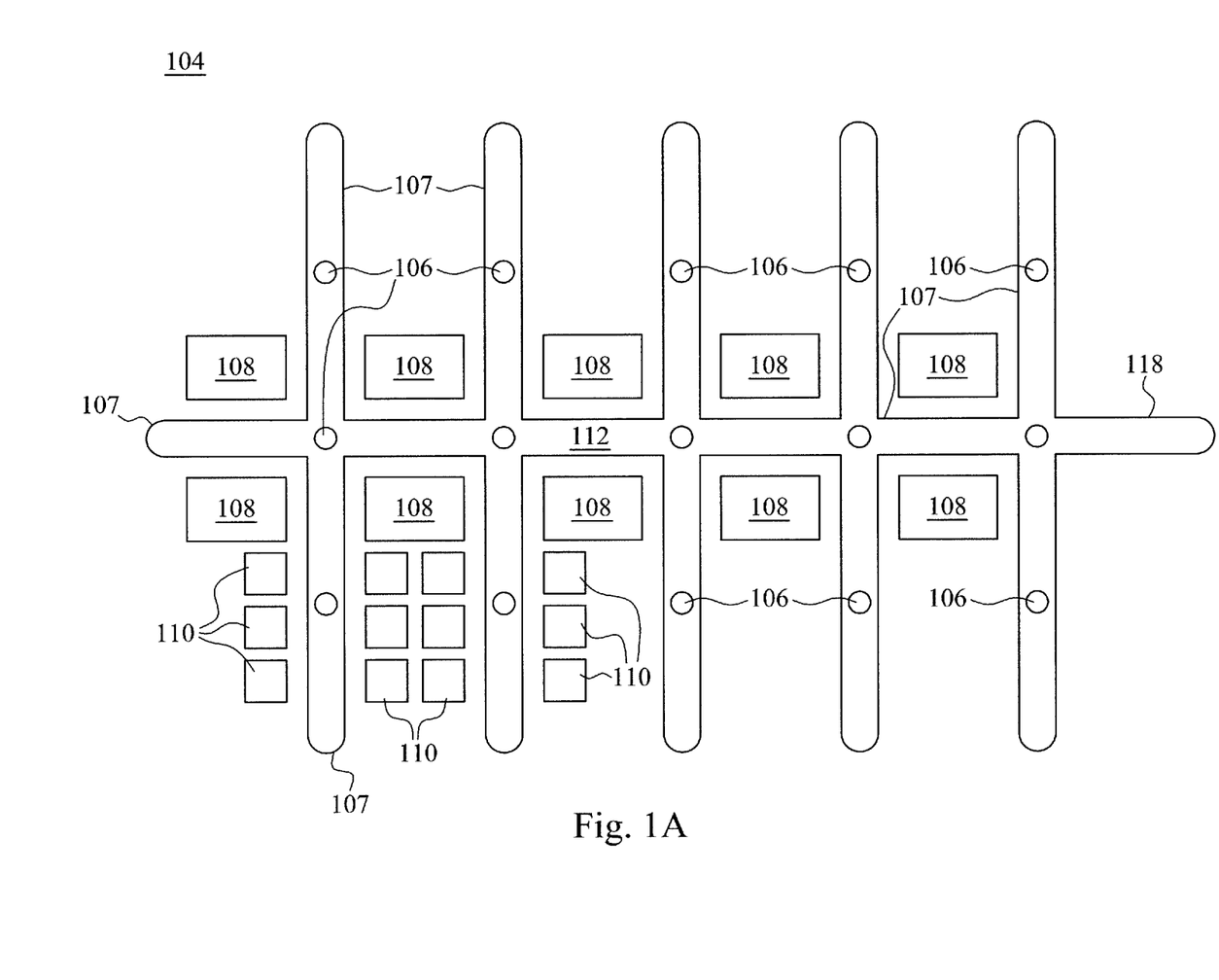
FIG. 1A is a schematic layout diagram of a semiconductor fabrication facility (FAB) with a sensory automated material handling systems (AMHS), in accordance with some embodiments.

FIG. 1A is a schematic layout diagram of a semiconductor FAB including a rail and vehicle system, in accordance with some embodiments. FAB includes a sensory AMHS 104 which may be comprised of, for example, automatic guided vehicles (AGVs), personal guided vehicles (PGVs), rail guided vehicles (RGVs), overhead shuttles (OHSs), and overhead hoist transports (OHTs). Additionally, various sensors 106 may be disposed on a rail 107 along different parts of the sensory AMHS 104. One or more wafer stockers 108 may be provided which are associated with the sensory AMHS 104 and operable for receiving and staging wafer carriers for processing in one or more wafer fabrication or metrology tools 110 (e.g., process tools) arranged adjacent to the rail 107. Also, the sensory AMHS 104 may have a remediation area 118 along a portion of the rail 107 where damaged vehicles may be directed to receive repairs and/or maintenance.

The wafer stockers 108 may include internal bins for temporarily staging and storing multiple wafer carriers in preparation for transport to a loadport of a process tool 110. Accordingly, wafer stockers 108 provide a wafer carrier transportation system and process flow buffer and holdover area. Each wafer stocker 108 includes an input/output port for loading and unloading wafer carriers from the wafer stockers 108. Also, the wafer stockers 108 may include one or more robotic arms (not shown) that are operable to grasp, raise/lower, store, and retrieve a wafer carrier from the stocker as will be known to those in the art. Stockers are conventional and will not be discussed in detail herein.

Figure 1B:
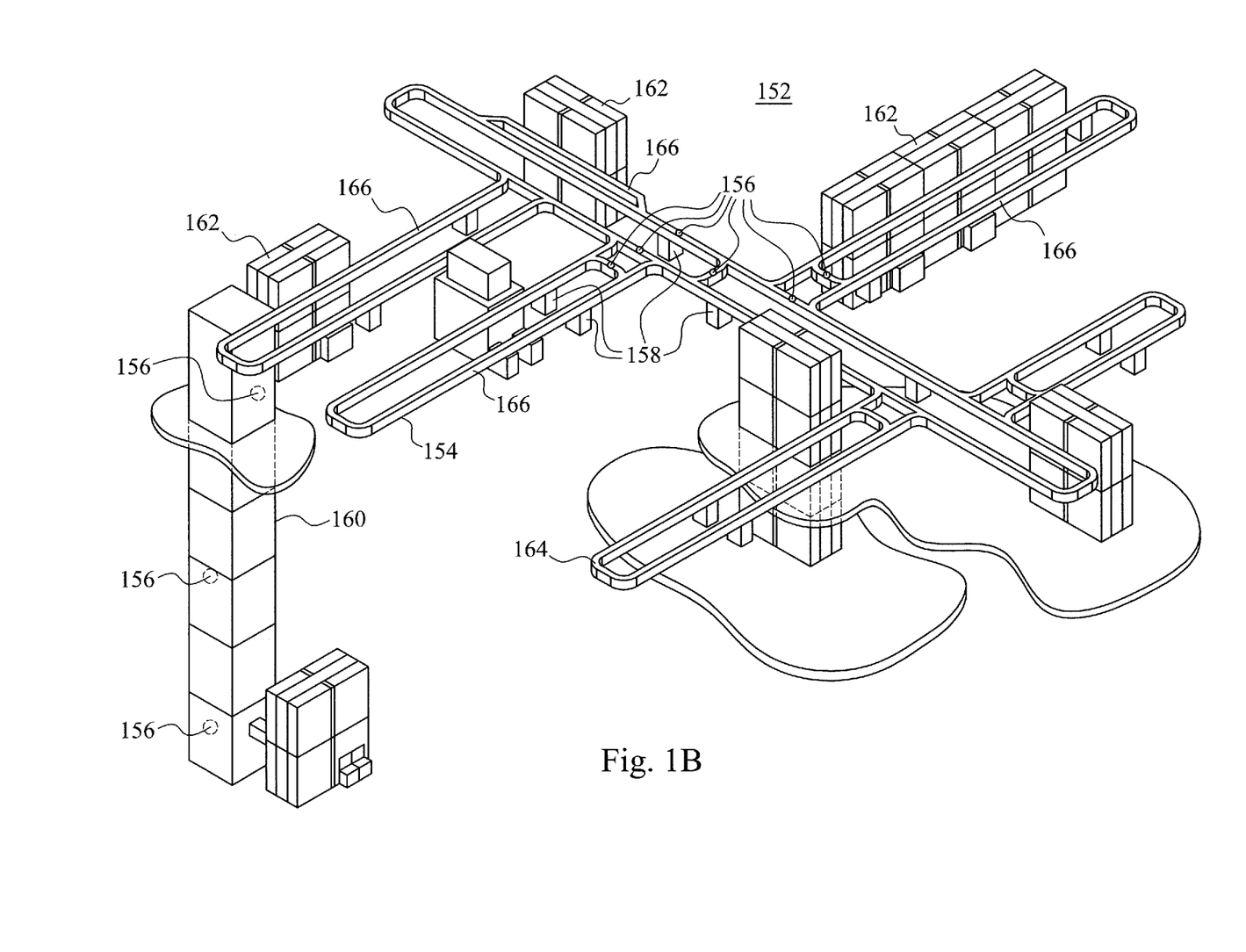
FIG. 1B is a perspective view of a semiconductor FAB including a sensory AMHS, in accordance with some embodiments.

FIG. 1B is a perspective view of a semiconductor FAB including a rail and vehicle system, in accordance with some embodiments. The FAB may include a sensory AMHS 152 which may include a rail system 154 with a variety of sensors 156 disposed on the rail system. The rail system 154 may also support a number of vehicles 158 that may move along the rail system as supported by the rail system in an overhead manner. For example, the vehicles 158 may be shuttles of an OHT. In addition to rails that are horizontally arranged on a single floor of a building, rails may also be vertically oriented, such as a rail within a vertical shaft 160 between floors of the FAB. Sensors 156 (illustrated with dotted lines to indicate that they are within the shaft 160) may also be disposed on a rail within the vertical shaft to collect sensory data concerning vehicles that move along a rail in the vertical shaft 160. A variety of equipment may be disposed adjacent to the rail system 154, such as wafer stockers 162. Also, a portion of the rail system 154 may be designated as a remediation area 164 for vehicles 158 that are out of active use and that are to undergo repairs, replacement, or other remediation.

The rail system 154 may be interconnected and mounted near a ceiling of a FAB. Multiple rails of the rail system 154 may be arranged into a transport network of any suitable configuration as appropriate for a given FAB, including without limitation one or more main branches of rails each having one or more multiple cross or lateral branches, multiple parallel branches, and loops. The sensory AMHS 152 may be organized into various parts or bays, which may be associated with a particular processing step or operation. Within a bay 166, the rails of the rail system 154 may be arranged in a loop type configuration.

Figure 2A:
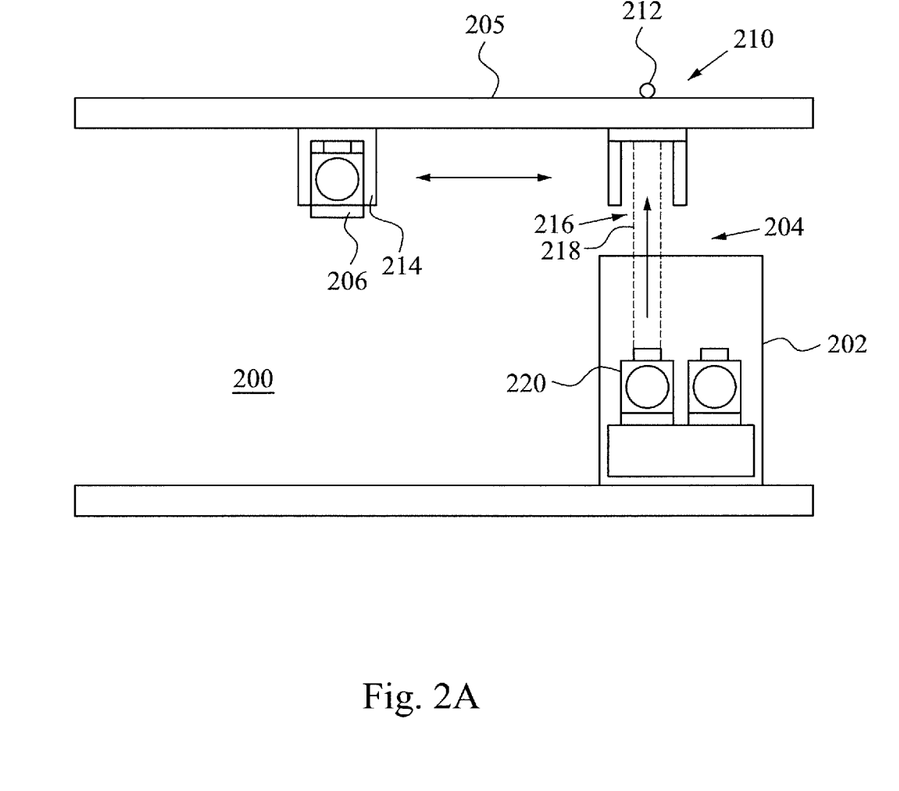
FIG. 2A is a side view of a portion of a semiconductor FAB and sensory AMHS, in accordance with some embodiments.

FIG. 2A is a side view of a portion of a FAB with a sensory AMHS, in accordance with some embodiments. The FAB may include a bay 200 that may include a process tool 202 for performing various semiconductor manufacturing, testing, or metrology steps. Multiple bays are typically provided on a floor of a FAB, arranged on either side of a main aisle area that may connect and be a path among the various bays. The bay 200 includes at least one process tool 202 having a loadport 204 for inserting and removing wafer carriers 206 into or from the tool for processing. The loadport 204 may include separate loading and unloading ports in some embodiments to expedite wafer carrier 206 switchover between the rail 208 and the tool 202. The process tool 202 may be any type of wafer handling, fabrication, testing, metrology, or other equipment commonly used in a semiconductor FAB.

The sensory AMHS 210 may include a network of tracks or rails 205 operable to guide the movement of one or more wheeled vehicles 214 which may be supported and suspended from the rail 205. In some embodiments, the rail 205 may be a monorail that is affixed to and suspended from a ceiling. The vehicle 214 may be operable to transport wafer carriers 206 through a fab for intra-bay or inter-bay movement. In one embodiment, each vehicle 214 may be configured and structured to hold one wafer carrier 206 at a given time and transport the carrier 206 in a generally horizontal direction from one location to another within each bay 200 (intra-bay) or between bays (inter-bay) across the sensory AMHS 210.

The vehicle 214 may be configured and operable to pickup, raise/lower, hold, articulate, and release a wafer carrier 206. Such vehicles 214 and rails 205 are known in the art and commercially available from companies such as Daifuku Company, Ltd. of Osaka, Japan and Muratec Automation Company, Ltd. of Aichi, Japan. The vehicle 214 may include a motorized or pneumatic hoisting mechanism generally comprised of a gripper assembly 216 including one or more retractable and extendable gripper arms 218 having a gripper 220 on the end thereof configured for locking onto a mating hook or flange on the wafer carrier 206. The gripper arms 218 are operable to raise and lower the gripper 220 and attached wafer carrier 206. Generally, a vehicle 214 transports a single wafer carrier 206 at a time.

The wafer carrier 206 may be any type of wafer carrier such as a standard mechanical interface (SMIF) pod or a front opening unified pod (FOUP). Each wafer carrier 206 holds a plurality of wafers. For example, one FOUP may hold approximately 25 wafers. A SMIF pod or FOUP generally includes various appurtenances as will be commonly recognized to those in the art. For example, the wafer carrier 206 may include coupling mechanisms for docking to a loading port of a process tool or stocker, hooks or flanges for grasping by the gripper of a vehicle 214, side rails for pickup by a robotic arm, plurality of internal slots for holding the wafers in spaced relationship, and openable/closeable and sealable doors to maintain the wafers in a controlled environment during transport isolated from the ambient FAB conditions to prevent contamination. Wafer carriers 206 are commercially-available from various companies, such as for example Entegris, Inc. of Billerica, Mass., USA.

Figure 2B:
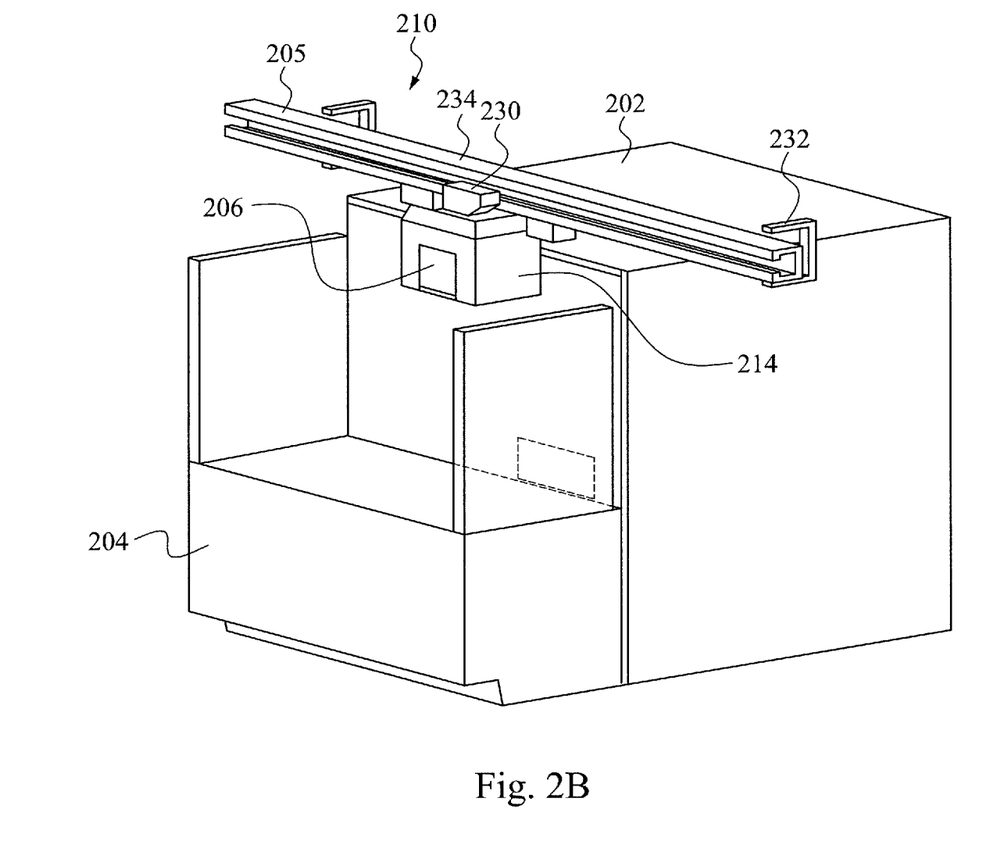
FIG. 2B is a perspective view of a process tool with a vehicle positioned near the load port of the tool, in accordance with some embodiments.

FIG. 2B is a perspective view of the process tool 202 and portion of the rail 205 with the vehicle 214 positioned near the load port of the tool 202, in accordance with some embodiments. The vehicle 214 may include at least one wheeled trolley 230 which is configured to complement and cooperate with the rails 205 for rolling movement of the vehicle 214 laterally or horizontally along the rail 205 in a conventional manner. Vehicle 214 is suspended and supported from the rail 205 via the trolley 230. Rails 205 of the sensory AMHS 210 may have any suitable cross-sectional configuration or orientation used in the art. In one possible, but non-limiting embodiment shown schematically in FIG. 2B, the rails 205 may be configured as C-shaped structural members generally made of a suitably strong metal such as steel to support the weight of the vehicle 214 carrying a fully loaded wafer carrier 206 held therein.

It will be appreciated by those in the art that other possible cross-sectional configurations of the rail 205 may be used, including without limitation box beams with a longitudinally-extending bottom slot that receives therethrough a vertical support such as a flange, rod, or other suitable structural member connecting a wheeled trolley movably disposed inside the rail to the attached vehicle suspended below. Accordingly, embodiments of the rail 205 with mating wheeled trolley 230 according to the present disclosure are not limited to any particular configuration so long as the vehicle 214 may be appropriately supported from the rail for rolling motion.

The rail 205 may be suspended from the ceiling of the FAB by intermittently spaced rail mounting brackets 232. The trolley wheels may be disposed internally within the interior space bounded by the rail 205 and may roll along the inside of the rail in either axial direction. Any suitable number of trolley wheels may be provided depending on the configuration of the rail and trolley used, and the weight of the vehicle 214 supported by the trolley 230. In some embodiments, trolley 230 includes a conventional trolley motor drive which is mechanically coupled to and operative to rotate a pair of wheels which are driven wheels for rolling the trolley along the rail 205.

A sensor 234 may be disposed on the rail to collect sensor data on vehicle performance. For example, the sensors 234 may be disposed at a position to collect sensor data on the vehicle's interaction with the tool 202, for example to characterize whether there is any abnormality with the vehicle's performance of moving along the rail 205 and/or picking up, raising, lower, holding, articulating, and/or releasing the wafer carrier 206. As discussed above, this type of sensor data may include sound, vibration, and/or image data collected from the sensor 234 mounted on the rail 205. Based on an analysis of this data (e.g., a statistical analysis for outliers, as discussed above), threshold values may be determined to characterize a trigger event. The analyzed data may include historical data collected by the sensor or by other sensors over a period of time. Alternatively, these threshold values may be predetermined as opposed to being determined by collected sensor data. These threshold values may be utilized to determine the occurrence of a trigger event that may include sensor data collected with values that are beyond the threshold values. Based on the trigger event, an associated remediation action may be initiated to remediate for the detected abnormality by the sensor data.

Figure 2C:
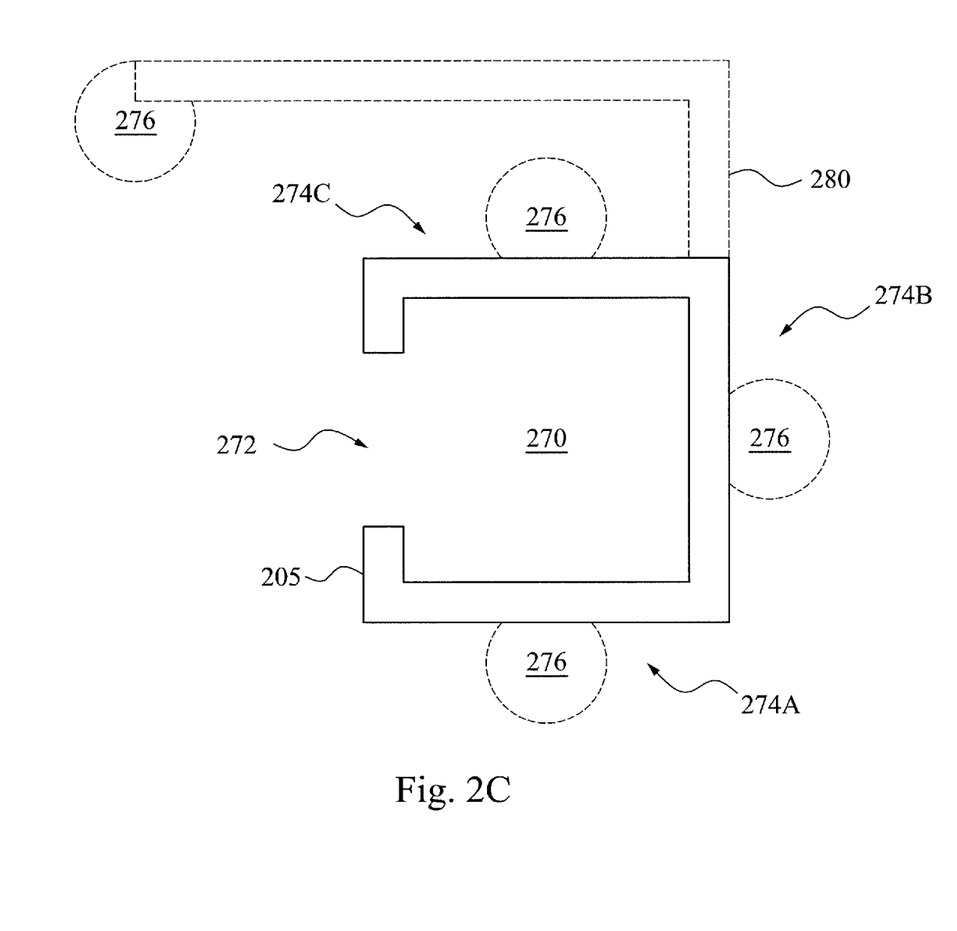
FIG. 2C is a side view of a rail with various possible locations of sensors supported by the rail, in accordance with some embodiments.

FIG. 2C is a side view of the rail 205 with various possible locations of sensors supported by the rail 205, in accordance with some embodiments. As introduced above, the rail may include a C-shape with a cavity 270 and a mouth 272 from which the cavity 270 may be accessed. Although the mouth is illustrated as open along a side (e.g., horizontally), the mouth may be open in other orientations as desired for different applications in accordance with various embodiments. For example, the mouth may be opened on the bottom 274A, other horizontal side 274B, or on a top 274C of the rail 205. The other horizontal side may refer to a horizontal side of the rail opposite to mouth 272 on a horizontal side. As discussed above, wheels may be disposed within the cavity 270 to provide movement to a vehicle via wheeled motion. Sensors 276 may be disposed on the rail 205 (e.g., be supported by the rail 205). For example, a sensor may be disposed on the bottom 274A, other horizontal side 274B, or on a top 274C of the rail 205. Also, the sensors 276 may be disposed on an external surface of the rail 205, such as directly at the external surface at the bottom 274A, other horizontal side 274B, or on a top 274C of the rail 205. Each of the sensors 276 are illustrated with dotted lines to illustrate that their illustrated placement is possible but optional and that only a single one of the sensors 276 or multiple ones of the sensors 276 may be located on or supported by the rail 205. Also, the sensors 276 may be supported not directly on the rail 205, but indirectly by the rail 205 via a sensor structure 280 that extends from the rail 205. In certain embodiments, the sensor structure 280 that extends from the rail may support an image sensor with an electronic imager directed toward the rail and/or a location where the vehicle may pass while traveling on the rail.

Figure 3:
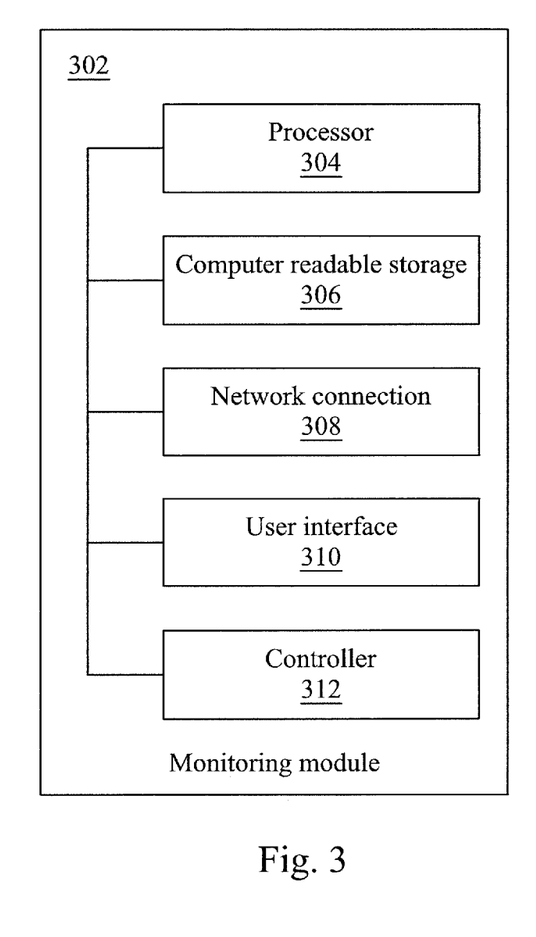
FIG. 3 is a block diagram of various functional modules of a sensory AMHS, in accordance with some embodiment.

FIG. 3 is a block diagram of various functional modules of a sensory AMHS, in accordance with some embodiment. The sensory AMHS may include a monitoring module 302. The monitoring module 302 may include a processor 304. In further embodiments, the processor 304 may be implemented as one or more processors. The processor 304 may be operatively connected to a computer readable storage module 306 (e.g., a memory and/or data store), a network connection module 308, a user interface module 310, and a controller module 312. In some embodiments, the computer readable storage module 306 may include sensory AMHS logic that may configure the processor 304 to perform the various processes discussed herein. The computer readable storage may also store parameter data, such as wafer data, tool data, sensor data, thresholds, identifiers for trigger events, identifiers for remediation actions, identifiers for vehicles, identifiers for sensors, and any other parameter or information that may be utilized to perform the various processes discussed herein.

The network connection module 308 may facilitate a network connection of the sensory AMHS with various devices and/or components of the sensory AMHS that may communicate within or external to the monitoring module 302. In certain embodiments, the network connection module 308 may facilitate a physical connection, such as a line or a bus. In other embodiments, the network connection module 308 may facilitate a wireless connection, such as over a wireless local area network (WLAN) by using a transmitter, receiver, and/or transceiver. For example, the network connection module 308 may facilitate a wireless or wired connection with sensors, the processor 304 and the controller module 312.

The monitoring module 302 may also include the user interface module 310. The user interface may include any type of interface for input and/or output to an operator of the sensory AMHS, including, but not limited to, a monitor, a laptop computer, a tablet, or a mobile device, etc.

The monitoring module 302 may include a controller module 312. The controller module 312 may be configured to control various physical apparatuses that control movement or functionality of a sensory AMHS, a vehicle and/or components of a vehicle. For example, the controller module 312 may be configured to control movement or functionality for at least one of a wheel, a rail (e.g., any moving parts of a rail that may affect movement of a vehicle, such as a rail switch), a sensor, an alarm, a communication device or any other controllable aspect of a sensory AMHS. For example, the controller module 312 may control a motor that may move at least one of a wheel, a vehicle, a rail switch, a sensor, and/or a robotic arm of a vehicle. The controller may be controlled by the processor and may carry out the various aspects of the various processes discussed herein.

Figure 4:
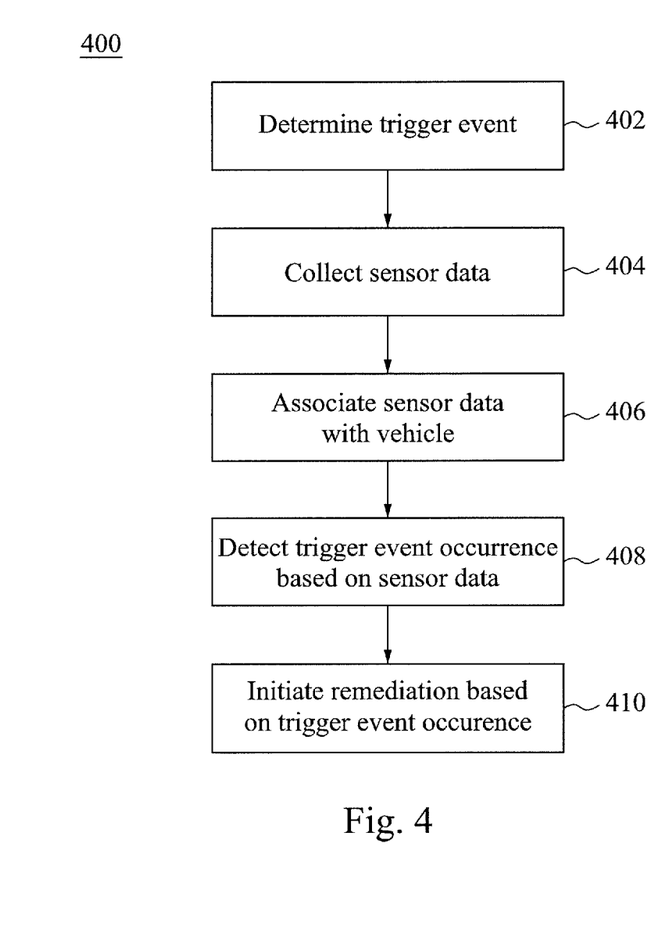
FIG. 4 is a flow chart of an AMHS sensing process, in accordance with some embodiments.

FIG. 4 is a flow chart of an AMHS sensing process, in accordance with some embodiments. The AMHS sensing process may be performed by a sensory AMHS, as discussed above. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, a trigger event may be determined. The trigger event may be any event for which further attention or remediation may be desired. For example, a trigger event may be an indicator of damage. In certain embodiments, a trigger event may be an indicator for routine maintenance, for example as determined by a counter of a number of times that a vehicle has passed by a proximity sensor. The trigger event may be based on historical sensor data (e.g., sensor data collected over a time period) and may be based on sensor data from currently active, or previously active sensors as part of a sensory AMHS. In certain embodiments, the trigger event may be predetermined, such as where the trigger event is not determined based on historical sensor data but is received by the sensory AMHS as determined from an external source.

As introduced above, the collected (e.g., aggregated) historical sensor data may be sensor data that characterizes vehicle's performance over time from each passing of one of the vehicles of the sensory AMHS, or each passing of a specific vehicle of the sensory AMHS. This historical sensor data may be continuous (e.g., where each data point is across a period of time) or discontinuous (e.g., where each data point represents a single point in time). Furthermore, this collected, historical sensor data may be aggregated and/or representable for analysis in any manner, such as in the time domain and/or the frequency domain. In particular embodiments, this historical sensor data may be collected and aggregated in any of a variety of formats or data structures, such as in a database, a relational table, a flat file, and the like.

Accordingly, by analyzing the historical sensor data from vehicular performance over time, a trigger event may be determined based on outlier detection from the aggregated data (e.g., detection of values which may be indicative of an outlier of a data set). Such an outlier may be indicative of abnormal performance of a vehicle. In certain embodiments, these outliers may determine threshold values, which may define a trigger event when met or passed. These trigger events may be reflective of meeting or passing a single or a combination of threshold values. For example, these outliers may define threshold values defining an abnormal amount of vibrations that may be indicative of a vehicle with damage. In certain embodiments, different trigger events may be defined that may be provoke (e.g., be mapped to) different types of remediation. For example, different trigger events may be indicative of abnormalities of different parts of the vehicle. For example, a trigger event (e.g., sounds or vibrations) indicative of damage to a wheel may be mapped to a remediation action that is an inspection, repair and/or replacement of the wheel. Also, a trigger event (e.g., sounds or vibrations) indicative of damage to a trolley use to suspend a vehicle from a rail may be mapped to a remediation action that is inspection, repair and/or replacement of the trolley.

These outliers may be determined in accordance with conventional statistical analysis for outliers. For example, the statistical analysis may include a noise, vibration harshness (NVH) study or analysis of the data (e.g., historical sensor data). As a further example, the statistical analysis may include any of: an octave analysis (e.g., determination of an outlier or critical point from sensor data analyzed by octaves), a spectrum analysis (e.g., determination of an outlier or critical point from sensor data analyzed by a spectrum or frequencies), a Fourier transform analysis (e.g., determination of an outlier or critical point from sensor data analyzed using a Fourier transform), a joint time frequency analysis (e.g., determination of an outlier or critical point from sensor data analyzed by time and frequency), an order analysis (e.g., determination of an outlier or critical point from analyzing sound and/or vibration sensor data), an order tracking analysis (e.g., determination of an outlier or critical point from analyzing sensor data in an order domain, as opposed to a frequency domain), a bode plot analysis (e.g., determination of an outlier or critical point from analyzing sensor data as represented in a bode plot), a frequency response analysis (e.g., determination of an outlier or critical point from analyzing sensor data as a frequency response), a vibration analysis (e.g., determination of an outlier or critical point from analyzing vibrational sensor data), and a stress analysis (e.g., determination of an outlier or critical point from analyzing stress and/or strain sensor data). In certain embodiments, the sensor data (e.g., historical sensor data) used to determine a trigger event may be a transient response and/or a steady state response of at least one of noise sensor data and/or vibrational sensor data.

At operation 404, sensor data may be collected by at least one sensor supported by a rail. As discussed about, the sensors may be disposed on or supported on a rail and configured to collect sensor data concerning performance of a vehicle that travels along the rail. In certain embodiments, the sensor data of operation 404 may be current sensor data utilized to detect occurrence of a trigger event. In further embodiments, the sensor data of operation 404 may be stored as historical sensor data utilized to determine or refine a trigger event, as discussed above.

Furthermore, as discussed above, this sensor data may be collected from multiple sensors and/or a single sensor. For example, certain sensors may be utilized to identify a passing vehicle (e.g., a radio frequency identification (RFID) sensor) and other sensors utilized to characterize the performance of the passing vehicle (e.g., a sound sensor, vibration sensor, or image sensor). As another example, different sensors may be utilized to monitor performance of a passing vehicle in conjunction with each other, such as one or more proximity sensors that may determine a time in passing from one point to another and a sound sensor to characterize sounds generated from the passing vehicle. This sensor data may be cross referenced and/or compared to better characterize the performance of the vehicle over a time period and to increase accuracy of detection among the sensors. Furthermore, by cross referencing sensor data, sensor abnormalities may also be detected and remediated (e.g., fixed or replaced) at or before the point of sensor failure. In further embodiments, a single sensor may be utilized for multiple purposes, such as to both identify a passing vehicle and characterize the performance of the passing vehicle. For example, an image sensor may collect image data, or a sound sensor may collect sound data that may identify the vehicle and also assess whether there is an abnormality in vehicle performance. Examples of sensors are discussed above and will not be repeated here for brevity.

At operation 406, sensor data may be associated with a particular vehicle. As discussed above, a vehicle may be identified using sensor data. For example, an RFID tag reading or other sensor data with readings unique to a particular vehicle may be utilized to identify the particular vehicle. Accordingly, the identified vehicle may be associated with sensor data that characterizes the performance of the identified vehicle. In certain embodiments, certain sensors may be utilized to collect sensor data to identify a vehicle and other sensors may be utilized to collect sensor data that characterizes the performance of a vehicle. In other embodiments, sensor data may be utilized to both identify a vehicle and characterize a vehicle's performance. For example, image data may be utilized to both identify a vehicle (e.g., by a bar code of the vehicle) as well as to characterize the performance of the vehicle.

At operation 408, the sensor data is analyzed for a trigger event. As discussed above, the trigger event may be an outlier determined from historical data and inferred via statistical analysis. Examples of the various statistical analyses are provided above. These trigger events may include a detection of sensor data that at least meets a threshold value. In certain embodiments, a trigger event may be specific to a particular identified vehicle. Further discussion of trigger event detection is provided above and will not be repeated here for brevity.

At operation 410, remediation may be initiated based on the trigger event. As discussed above, the remediation action may be mapped to a particular trigger event such that different trigger events may cause initiation of different remediation actions. For example, a trigger event for detection of a wheel defect may be different than a trigger event for detection of a trolley defect or a robotic arm defect. In certain embodiments, initiation of a remediation action may include control of a vehicle to move to a remediation area for a servicing. Also, in certain embodiments, initiation of a remediation action may include notification of specific personnel or other resources for a FAB to attend to the remediation action. Examples of remediation events may include inspection, repair, and/or replacement of a part of a vehicle causing abnormal performance of the vehicle and/or replacement of the vehicle itself with another vehicle.

In an embodiment an automated material handling system (AMHS) for a semiconductor fabrication facility (FAB) includes: a sensor supported by a rail, wherein the sensor is configured to collect sensor data characterizing a vehicle that moves along the rail, wherein the vehicle is configured to carry at least one wafer; and a monitoring module configured to: detect a trigger event based on the sensor data, and initiate a remediation action in response to the trigger event.

In another embodiment, a system includes a sensor supported by a stationary rail, wherein the sensor is configured to collect sensor data characterizing a vehicle that moves along the stationary rail while suspended from the stationary rail via a trolley, wherein the vehicle is configured to carry at least one wafer while moving along the stationary rail via rolling movement; and a monitoring module configured to: determine a trigger event based on historical sensor data from the sensor, detect the trigger event based on the sensor data, and initiate a remediation action in response to the trigger event.

In another embodiment, a method includes: collecting sensor data from a sensor supported by a rail, wherein the sensor data characterizes a vehicle that moves along the rail, wherein the vehicle is configured to carry at least one wafer while moving along the rail; detecting a trigger event based on the sensor data; and initiating a remediation action in response to the trigger event.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An automated material handling system (AMHS) for a semiconductor fabrication facility (FAB), comprising:
    a sensor supported by a rail, wherein the sensor is configured to collect sensor data characterizing a vehicle that moves along the rail, wherein the sensor is mounted on a sensor extension structure supported by the stationary rail and the vehicle is configured to carry at least one wafer; and
    a monitoring module configured to:
        detect a trigger event based on the sensor data, and
        initiate a remediation action in response to the trigger event.

2. The system of claim 1, wherein the vehicle is configured to carry a wafer carrier that stores the at least one wafer.

3. The system of claim 1, wherein the vehicle is movable on the rail via rolling movement.

4. The system of claim 1, wherein the rail is stationary and the vehicle is suspended from the rail via a trolley.

5. The system of claim 1, wherein the monitoring module is configured to:
    determine the trigger event based on an analysis of historical sensor data, wherein the analysis is at least one of: an octave analysis, a spectrum analysis, a Fourier transform analysis, a joint time frequency analysis, an order analysis, an order tracking analysis, a bode plot analysis, a frequency response analysis, a vibration analysis, and a stress analysis.

6. The system of claim 5, wherein the analysis determines the trigger event as a threshold value for the sensor data.

7. The system of claim 6, wherein the threshold value is an outlier.

8. A system, comprising:
    a sensor supported by a stationary rail, wherein the sensor is configured to collect sensor data characterizing a vehicle that moves along the stationary rail while suspended from the stationary rail via a trolley, wherein the vehicle is configured to carry at least one wafer while moving along the stationary rail via rolling movement; and
    a monitoring module configured to:
        determine a trigger event based on historical sensor data from the sensor,
        detect the trigger event based on the sensor data, and
        initiate a remediation action in response to the trigger event, wherein the trigger event is based on a noise, vibration, and harshness (NVH) study of the historical sensor data.

9. The system of claim 8, wherein the sensor data is at least one of a transient response and steady-state response of at least one of noise and vibrations.

10. The system of claim 8, wherein the sensor is located on an external surface of the stationary rail.

11. The system of claim 8, wherein the sensor is mounted on a sensor extension structure supported by the stationary rail.

12. The system of claim 8, wherein the stationary rail extends vertically within a vertical shaft.

13. A method, comprising:
    collecting sensor data from a sensor supported by a rail, wherein the sensor data characterizes a vehicle that moves along the rail, wherein the vehicle is configured to carry at least one wafer while moving along the rail;
    detecting a trigger event based on the sensor data; and
    initiating a remediation action in response to the trigger event, wherein the trigger event is based on a noise, vibration, and harshness (NVH) study of the sensor data.

14. The method of claim 13, comprising:
    detecting another trigger event based on the sensor data; and
    initiating a different remediation action in response to the another trigger event.

15. The method of claim 13, further comprising:
    determining the trigger event based on historical sensor data from the sensor.

16. The method of claim 15, further comprising:
    determining the trigger event by performing, based on the historical sensor data, at least one of: an octave analysis, a spectrum analysis, a Fourier transform analysis, a joint time frequency analysis, an order analysis, an order tracking analysis, a bode plot analysis, a frequency response analysis, a vibration analysis, and a stress analysis.

17. The method of claim 13, wherein the trigger event is a sensor data value collected from the sensor that exceeds a threshold value.

18. The method of claim 17, wherein the threshold value is an outlier.

19. The method of claim 13, further comprising:
    controlling the vehicle to move to a remediation area along the rail in response to the trigger event.

20. The method of claim 13, further comprising:
    collecting at least one of a transient response and steady-state response of at least one of noise and vibrations.

* * * * *